(12) United States Patent
    Liu (10) Patent No.: US 9,236,405 B2
(45) Date of Patent: Jan. 12, 2016

(54) ARRAY SUBSTRATE, MANUFACTURING METHOD AND THE DISPLAY DEVICE THEREOF

(71) Applicant: BOE Technology Group Co., Ltd., Beijing (CN)

(72) Inventor: Xiang Liu, Beijing (CN)

(73) Assignee: BOE TECHNOLOG GROUP CO., Ltd., Beijing (CN)

( * ) Notice: Subject to any disclaimer, the term of this patent is extended or adjusted under 35 U.S.C. 154(b) by 0 days.

(21) Appl. No.: 13/995,932

(22) PCT Filed: Nov. 23, 2012

(86) PCT No.: PCT/CN2012/085181
    § 371 (c)(1),
    (2) Date: Jun. 19, 2013

(87) PCT Pub. No.: WO2013/155840
    PCT Pub. Date: Oct. 24, 2013

(65) Prior Publication Data
    US 2014/0061635 A1    Mar. 6, 2014

(30) Foreign Application Priority Data
    Apr. 20, 2012 (CN) .......................... 2012 1 0119036

(51) Int. Cl.
    *H01L 27/12*       (2006.01)
    *G02F 1/1368*      (2006.01)
    (Continued)

(52) U.S. Cl.
    CPC ............ *H01L 27/127* (2013.01); *G02F 1/1368* (2013.01); *H01L 27/1214* (2013.01);
    (Continued)

(58) Field of Classification Search
    CPC .............. H01L 27/1214; H01L 27/127; H01L 27/1218
    USPC ........................................... 257/43
    See application file for complete search history.

(56) References Cited

U.S. PATENT DOCUMENTS

2005/0142681 A1   6/2005 Soh
2008/0061295 A1   3/2008 Wang et al.
(Continued)

FOREIGN PATENT DOCUMENTS

CN      1637593 A    7/2005
CN    101416320 A    4/2009
(Continued)

OTHER PUBLICATIONS

International Search Report (Chinese language) issued by the International Searching Authority, rendered Feb. 7, 2013, 15 pages.
(Continued)

*Primary Examiner* — Jerome Jackson, Jr.
*Assistant Examiner* — Damian A Hillman (57) ABSTRACT

An array substrate, a manufacturing method thereof and a display device are provided. In the manufacturing method, the needed patterns can be formed by just three photolithography processes, wherein the semiconductor layer and the etch stop layer are formed by just one photolithography process. The method reduces one photolithography process compared to the method of the state of the art, which forms the pattern of the semiconductor layer and the etch stop layer by two photolithography processes respectively, thereby greatly reducing the manufacturing cost and improving the production efficiency.

19 Claims, 5 Drawing Sheets

(51) Int. Cl.
*H01L 29/66* (2006.01)
*G02F 1/1362* (2006.01)

(52) U.S. Cl.
CPC ...... *H01L27/1288* (2013.01); *H01L 29/66765* (2013.01); *G02F 2001/136231* (2013.01); *G02F 2001/136295* (2013.01)

(56) References Cited

U.S. PATENT DOCUMENTS

| | | | |
|---|---|---|---|
| 2008/0176346 A1 | 7/2008 | Shih et al. | |
| 2009/0001374 A1 | 1/2009 | Inoue et al. | |
| 2011/0168997 A1* | 7/2011 | Lee et al. | 257/57 |
| 2011/0193076 A1* | 8/2011 | Yun et al. | 257/43 |
| 2011/0273639 A1 | 11/2011 | Xie et al. | |
| 2012/0025194 A1* | 2/2012 | Kim et al. | 257/60 |
| 2012/0086013 A1 | 4/2012 | Lee et al. | |
| 2014/0061635 A1 | 3/2014 | Liu | |

FOREIGN PATENT DOCUMENTS

| | | | |
|---|---|---|---|
| CN | 102148259 A | | 8/2011 |
| CN | 102237305 A | * | 11/2011 |
| CN | 102237305 A1 | * | 11/2011 |
| CN | 102709239 A | * | 10/2012 |

OTHER PUBLICATIONS

The State Intellectual Property Office of the People's Republic of China ("SIPO") (Chinese Language) Office Action issued on Oct. 18, 2013 by SIPO in Chinese Patent Application No. 201210119036.2; seven (7) pages.
English Translation of the State Intellectual Property Office of the People's Republic of China ("SIPO") Office Action issued on Oct. 18, 2013 by SIPO in Chinese Patent Application No. 201210119036. 2; six (6) pages.
Espacenet Bibliographic Data, Abstract of CN101416320(A) listed above, 1 page.
Espacenet Bibliographic Data, Abstract of CN102237305(A) listed above, 2 pages.
Espacenet Bibliographic Data, Abstract of CN1637593(A) listed above, 1 page.
Espacenet Bibliographic Data, Abstract of CN102148259(A) listed above, 1 page.
Espacenet Bibliographic Data, Abstract of CN102709239(A) listed above, 1 page.
Second Office Action issued by the Chinese Patent Office for Chinese Patent Application No. 201210119036.2, 6pgs.
English translation of Second Office Action issued by the Chinese Patent Office for Chinese Patent Application No. 201210119036.2, 6pgs.
International Preliminary Report on Patentability issued by the International Bureau of WIPO on Oct. 21, 2014 for International Application No. PCT/CN2012/085181, 12 pages.

* cited by examiner

ARRAY SUBSTRATE, MANUFACTURING METHOD AND THE DISPLAY DEVICE THEREOF

CROSS REFERENCE TO RELATED APPLICATIONS

This application is based on International Application No. PCT/CN2012/085181 filed on Nov. 23, 2012, which claims priority to Chinese National Application No. 201210119036.2, filed on Apr. 20, 2012, the contents of which are incorporated herein by reference.

TECHNICAL FIELD

Embodiments of the invention relates to an array substrate, a manufacturing method thereof and a display device comprising the array substrate.

BACKGROUND

A Thin Film Transistor Liquid Crystal Display (TFT-LCD) has the advantages of small volume, low power consumption, no radiation et al., and occupies the dominant position in the current market of the flat panel display.

TFT-LCD has obtained the rapid development for the last few years, especially the liquid crystal television, and its size and resolution are improved continually. The liquid crystal television with large size and high resolution has become a mainstream for the development of the TFT-LCD. At present, the world's largest liquid crystal television has the size larger than 100 inches. As the continual increase of the TFT-LCD size and the improvement of the resolution, the driving circuit with higher frequency is usually adopted in order to improve the display quality.

However, the carrier mobility of the current amorphous silicon (a-Si) thin film transistors can not meat the demand due to the continual increase of the TFT-LCD size and the frequency of the driving circuit. The carrier mobility of the a-Si thin film transistors is typically at about 0.5 $cm^2$/VS. The current carrier mobility of the a-Si is obviously hard to meet the demand when the LCD size is over 80 inches and the driving frequency is 120 Hz, which needs the carrier mobility more than 1 $cm^2$/VS. Although the poly-Si thin film transistor has high mobility, it is rarely used because of its poor uniformity and complex manufacturing process.

The metal oxide thin film transistor has attracted attentions and become a study focus of the large size, high refresh frequency LCD and organic light emitting diode (OLED) panels because of its high mobility, good uniformity and transparency, and simple manufacturing process, which can meet the requirements of the manufacturing process and the electrical properties for used in the large size LCD and active organic electroluminescence.

SUMMARY

Embodiments of the invention provide an array substrate, a manufacturing method and a display device thereof, the method can simplify the manufacturing process of the metal oxide thin film transistor, improve production efficiency and reduce the manufacturing cost.

The embodiment of the present invention provides an manufacturing method of an array substrate, and it comprises:

forming patterns of gate electrodes and gate lines, and a gate insulating layer on a substrate;

forming a semiconductor layer on the substrate formed with said gate insulating layer and the patterns of said gate electrode and said gate lines, and forming an etch stop layer on said semiconductor layer;

forming a first photoresist layer on said etch stop layer, and forming a photoresist-completely-reserved region, a photoresist-non-unreserved region and a photoresist-partially-reserved region of said first photoresist layer by one exposure and development process with a half-tone or gray-tone mask;

etching and removing the etch stop layer and the semiconductor layer corresponding to said photoresist-non-unreserved regions of said first photoresist layer so as to form a pattern of the semiconductor layer, and removing the photoresist in said photoresist-partially-reserved region of said first photoresist layer by one photoresist aching process so as to expose the etch stop layer, and then etching the exposed etch stop layer to expose such a contact zone of said semiconductor layer that the contact zone are to be electrically connected with source and drain electrodes;

forming patterns of the source and drain electrodes, data lines and pixel electrodes on the substrate formed with said patterns of the semiconductor layer and said exposed contact zone.

The embodiment of the present invention also provides an array substrate, and said array substrate is manufactured with the method according to the above-mentioned manufacturing method. The array substrate comprises:

a substrate;

gate electrodes and gate lines, formed on said substrate;

a gate insulating layer, formed on said gate electrode and said gate lines and covering the entire said substrate;

a semiconductor layer, arranged over said gate electrode and formed on said gate insulating layer;

an etch stop layer, formed on metal oxide semiconductor layer, and said etch stop layer is provided with holes formed therein;

source electrodes and drain electrodes, formed on said etch stop layer, said source and drain electrodes are respectively electrically connected to said semiconductor layer via the respective holes.

The embodiment of the present invention also provides a display device comprising the above-mentioned array substrate.

From the above, we can see the display device, the array substrate and the manufacturing method provided by the embodiments of the present invention at least have the following beneficial effects:

During the manufacturing process of the array substrate in accordance with the embodiment of the present invention, the pattern can be formed by merely using three photolithography processes, wherein the semiconductor layer and the etch stop layer can be formed by merely using one photolithography process. The method can reduce one photolithography process compared to the method of the state of the art, in which the patterns of the semiconductor layer and the etch stop layer are formed by two photolithography processes respectively, as a result, the manufacturing cost can be greatly reduced and the production efficiency can be improved.

In the embodiment of the present invention, the etch stop layer of the semiconductor layer is formed just after the formation of the metal oxide semiconductor layer, which can reduce the intermediate steps of the process, and avoid the damage to the semiconductor layer from the intermediate steps, so the semiconductor layer can be well protected. At the same time, a fairly good contact interface can be formed between the semiconductor layer and the etch stop layer by directly forming the etch stop layer on the semiconductor layer, which is favorable for the improvement of the electric property of the metal oxide thin film transistor.

In the embodiment of the present invention, the patterns of the source electrodes, the drain electrodes, data lines and the transparent pixel electrode are formed by one photolithography process, and the transparent pixel metal layer is located under the source and drain electrodes. Thus, the transparent pixel electrode can directly in contact with the metal oxide semiconductor layer, so that the contact resistance between the source/drain electrodes and the semiconductor layer can be reduced, which is favorable for the formation of the stable contact interface and for the improvement of the electrical property of the metal oxide thin film transistor.

In the embodiment of the present invention, the electric connection between the semiconductor layer and the source/drain electrodes is achieved by the holes in the etch stop layer, which can reduce the damage to the semiconductor layer in the etching process to the etch stop layer, and be favorable for improvement of the performance of the thin film transistor. Besides, the through-hole structure can greatly reduce the surface area needed to be etched in the etch stop layer, so as to greatly improve the production efficiency.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

The metal oxide thin film transistor has become a study focus of the large size, high refresh frequency LCD and OLED panel. In manufacturing the metal oxide thin film transistor, an etch stop layer is always added on the metal oxide semiconductor layer in order to avoid destruction to the metal oxide semiconductor layer during the process of etching source and drain metal electrodes. Since the formation of the etch stop layer always needs to increase an additional photolithography process, it is apparently that the additional photolithography process will not only greatly increase the manufacturing cost, but also affect the production efficiency seriously.

In order to reduce the manufacturing cost of an array substrate made from metal oxide thin film transistor and improve the production efficiency, the patterns of the metal oxide semiconductor layer and etch stop layer are formed simultaneously by using one photolithography process in the embodiments of the invention. As a result, the additional one photolithography process can be eliminated, the production efficiency can be improved, and the manufacturing cost can be reduced.

The technical solutions of the embodiments will be described in detail in connection with the drawings related to the embodiments of the invention.

Embodiment 1

Figure 10:
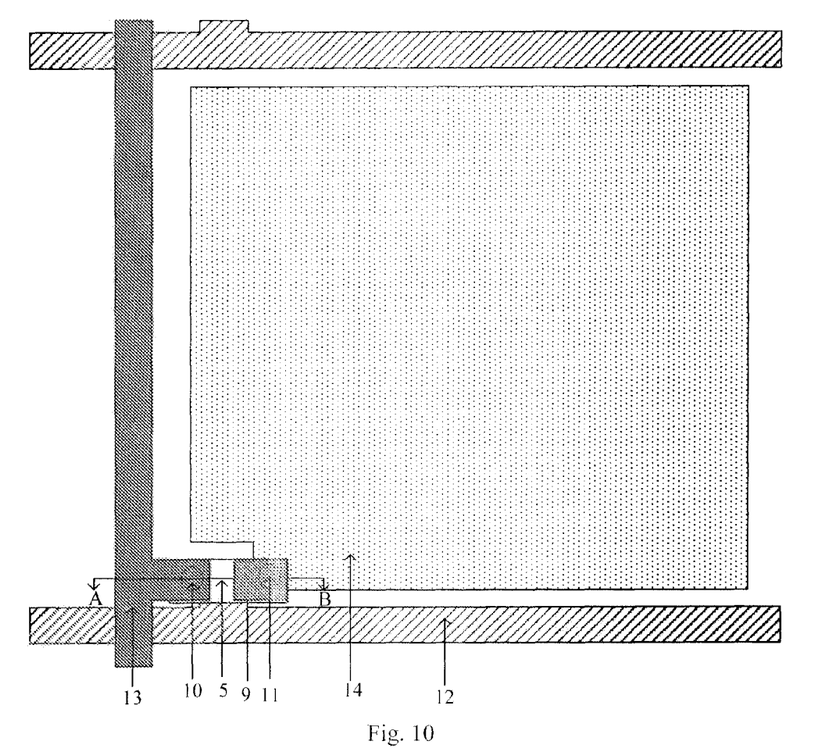
FIG. 10 is the planar schematic diagram of an array substrate provided in an embodiment of the present invention.

The embodiment of the invention provides a manufacturing method of array substrate. FIG. 10 is a planar schematic diagram of the resulting array substrate by using the method. The manufacturing method of an array substrate according to the embodiment of the invention comprises the following steps:

Step S11, forming a gate metal layer on a substrate, and forming patterns of gate electrodes and gate lines by a first photolithography process.

Herein, the substrate can be a glass, quartz, plastic substrate, or the like. First, sputtering, thermal evaporation or other film-forming method can be adopted to form the gate metal layer. The thickness of the gate metal layer can be 500-4000 Å, and the material of it can be metals, such as chromium (Cr), tungsten (W), titanium (Ti), tantalum (Ta), molybdenum (Mo), aluminum (Al), copper (Cu), or their alloys. The gate metal layer can be of a single-layer metal structure, and also can be of a multi-layer structure with at least two layers, in which the respective layers are made of different metals. Then, a photoresist is coated on the gate metal layer; next, the photoresist is exposed and developed by using a mask with a designed graph, and then the exposed gate metal layer is etched, so as to form patterns of the gate lines and the gate electrodes. At last, the residual photoresist is peeled off.

Figure 1:
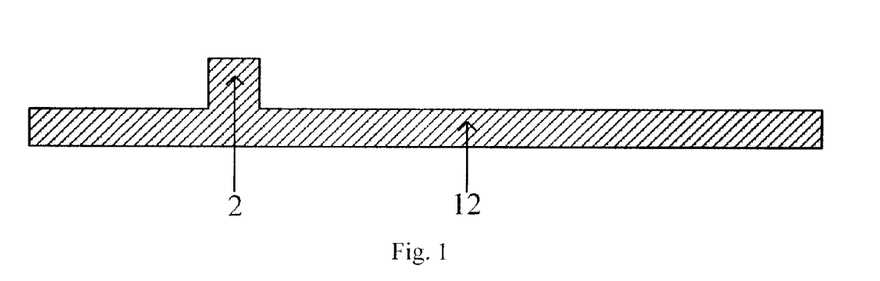
FIG. 1 is the planar schematic diagram of an array substrate in a manufacturing method of an embodiment of the present invention.
Figure 2:
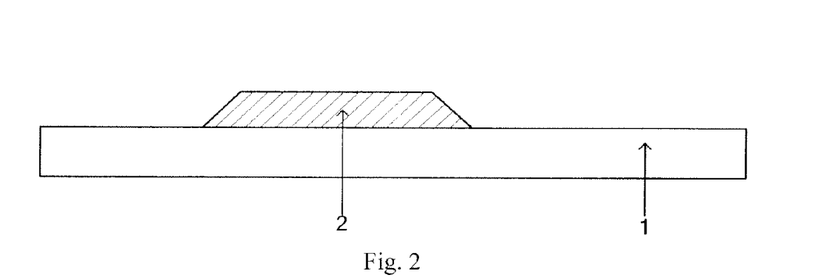
FIG. 2 to FIG. 9 are the cross-section schematic diagrams of an array substrate along line A-B as showed in FIG. 10 in an manufacturing method of an embodiment of the present invention.

FIG. 1 shows a planar schematic diagram of the array substrate after the first photolithography process. For easy to illustrate, FIG. 1 only shows a gate line 12, and a gate electrode 2 connected to the gate line 12. FIG. 2 shows a cross-section diagram of the array substrate taken along line A-B as showed in FIG. 10 after the first photolithography process, in which the gate electrode 2 is formed on the substrate 1.

Step S12, forming a gate insulating layer on the substrate that has been processed by the first photolithography process.

Herein, on the substrate obtained from step S11, a gate insulating layer can be deposited by a method, such as Plasma Enhanced Chemical Vapor Deposition (PECVD), etc. The gate insulating layer can be formed on both of the gate line and gate electrode and cover the entire substrate. The material of the gate insulating layer can be silicon oxide (e.g. $SiO_x$), silicon nitride (e.g. $SiN_x$), silicon oxynitride, or the like. The thickness of the layer can be 2000-15000 Å. In the process of PECVD, the reactant gas corresponding to the silicon oxide can be $SiH_4$ or $N_2O$; the reactant gas corresponding to the silicon nitride can be $SiH_4$, $NH_3$ or $N_2$; the reactant gas corresponding to the silicon oxynitride can be $SiH_2Cl_2$, $NH_3$ or $N_2$. The gate insulating layer can be of single-layer structure, and also can be of multi-layer structure.

Figure 3:
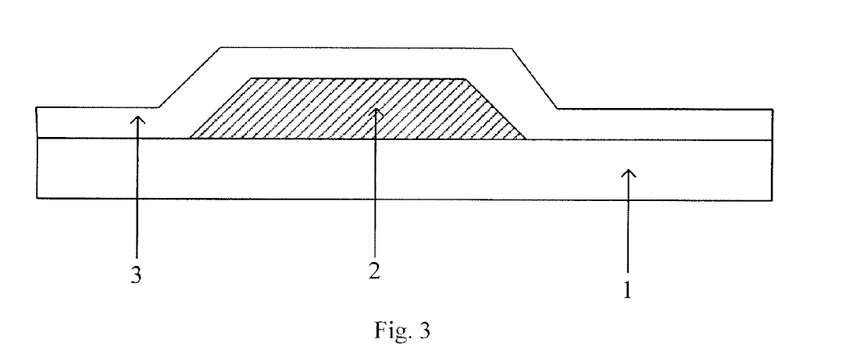

FIG. 3 shows a cross-section diagram of the array substrate after the completion of the step S12, in which the gate insulating layer 3 covers the upper surfaces of the gate electrode 2 and the substrate 1.

Step S13, forming a semiconductor layer on the substrate obtained from the step S12, and forming an etch stop layer on the semiconductor layer, wherein the semiconductor layer can be metal oxides.

Herein, at first, a metal oxide film can be deposited on the substrate by a sputtering process to form a semiconductor layer. Specifically, the metal oxides can be Indium gallium zinc oxide (IGZO), hafnium indium zinc oxide (HIZO), IZO, a-InZnO, a-InZnO, ZnO:F, $In_2O_3$:Sn, $In_2O_3$:Mo, $Cd_2SnO_4$, ZnO:Al, $TiO_2$:Nb, Cd—Sn—O, or the like, and it also can be a mixture of at least two said metal oxides. The thickness of the semiconductor layer can be 50-1000 Å

Then, an etch stop layer is deposited by PECVD process. The thickness of the etch stop layer can be 500-3000 Å. The material of the etch stop layer can be silicon oxide, silicon nitride, or silicon oxynitride. In the process of PECVD, the reactant gas corresponding to the silicon oxide can be $SiH_4$ or $N_2O$. The reactant gas corresponding to the silicon nitride can be $SiH_4$, $NH_3$ or $N_2$. The reactant gas corresponding to the silicon oxynitride can be $SiH_2Cl_2$, $NH_3$ or $N_2$. In the present embodiment, the material of etch stop layer can also be $Al_2O_3$. The etch stop layer can be of single-layer structure, and also can be of a multi-layer structure with at least two layers.

Figure 4:
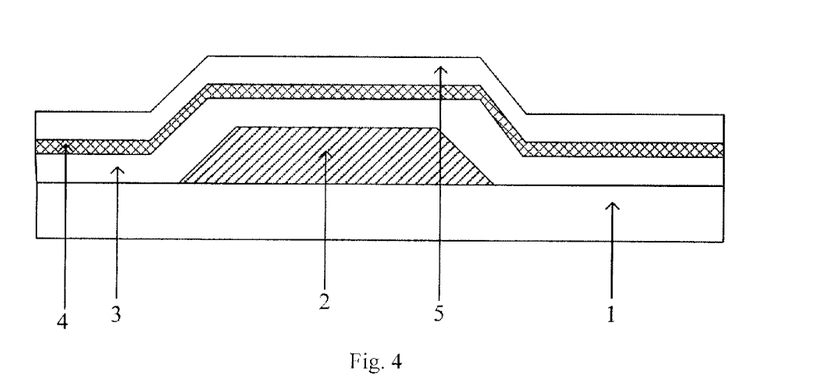

FIG. 4 shows the cross-section diagram of the array substrate after the completion of the step S13, wherein a semiconductor layer 4 and an etch stop layer 5 are formed on the gate insulating layer 3 sequentially.

Step S14, forming a first photoresist layer on the etch stop layer, and forming a photoresist-completely-reserved region, a photoresist-non-unreserved region and a photoresist-partially-reserved region of the first photoresist layer by one exposure and development process with a half-tone or gray-tone mask.

Figure 5:
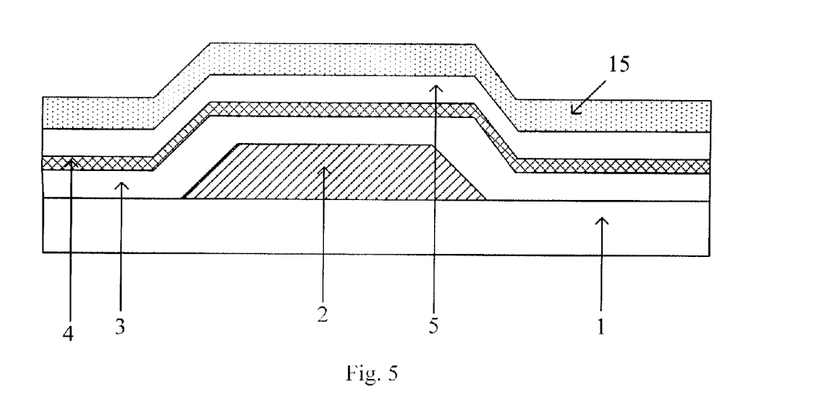
Figure 6:
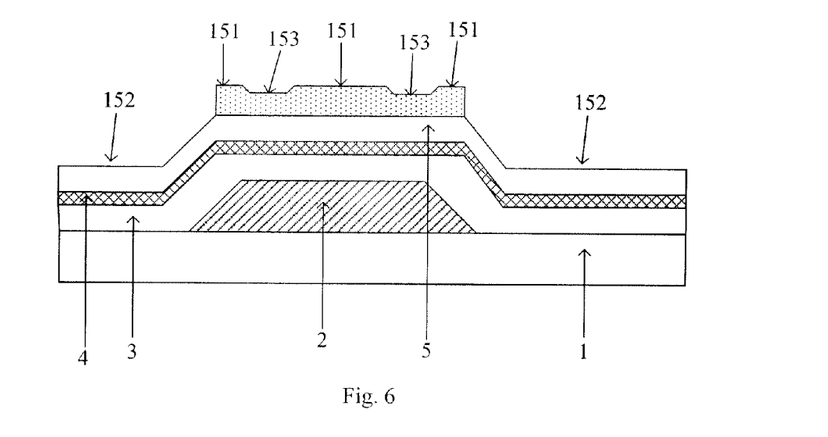

As shown in FIG. 5, first, a first photoresist layer 15 is coated on the etch stop layer, and then, a half-tone or gray-tone mask with a designed graph is used to perform the exposure and development process on the first photoresist layer 15 so as to form photoresist-completely-reserved regions 151, photoresist-photoresist-non-unreserved regions 152 and photoresist-partially-reserved regions 153 in the first photoresist layer 15, wherein the photoresist-completely-reserved regions 151 correspond to a pattern of the semiconductor layer to be formed, and the photoresist-partially-reserved regions 153 correspond to the regions of the semiconductor layer to be contacted with the drain and source electrodes. FIG. 6 shows the cross-section diagram of the substrate after the exposure and development process described above, in which the photoresist layer will be photoresist-completely-reserved in the photoresist-completely-reserved regions 151, so there is no change to the thickness of the photoresist layer; the photoresist in the photoresist-non-unreserved regions 152 will be completely removed; and the photoresist layer in the photoresist-partially-reserved regions 153 will become thinner, as a result, the etch stop layer 5 in these regions will still be covered with the thinner photoresist layer.

Step S15, removing both the etch stop layer and the semiconductor layer corresponding to the photoresist-non-unreserved regions of the first photoresist layer to form a pattern of the semiconductor layer, and removing the photoresist in the photoresist-partially-reserved regions of the first photoresist layer by one photoresist ashing process to expose the etch stop layer, and then etching the exposed etch stop layer to expose such a contact zone of the semiconductor layer that the contact zone are to be connected with source and drain electrodes.

Figure 7:
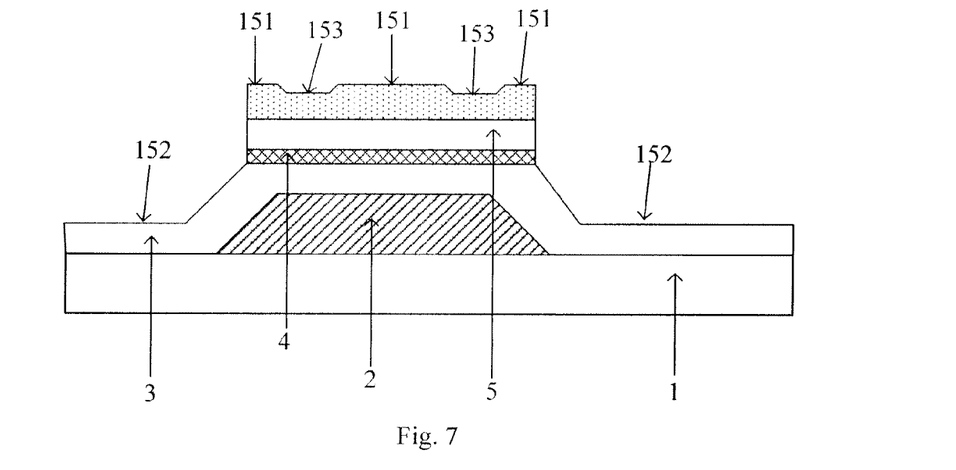
Figure 8:
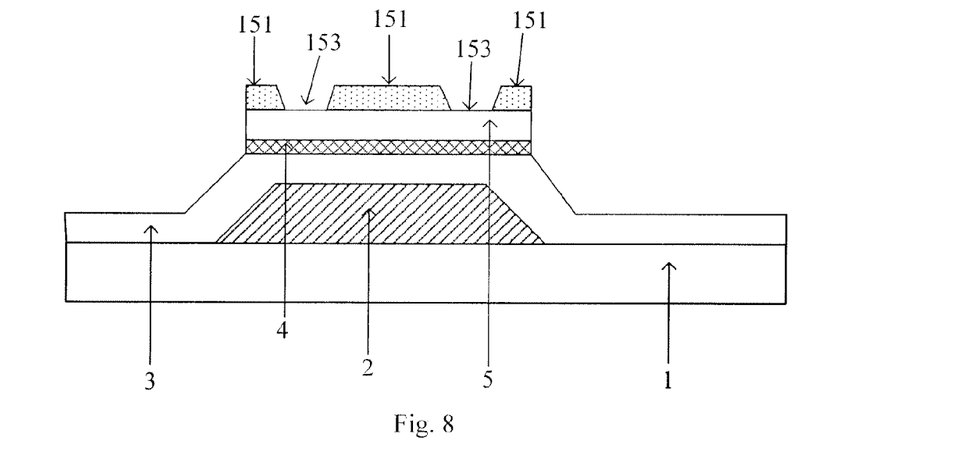
Figure 9:
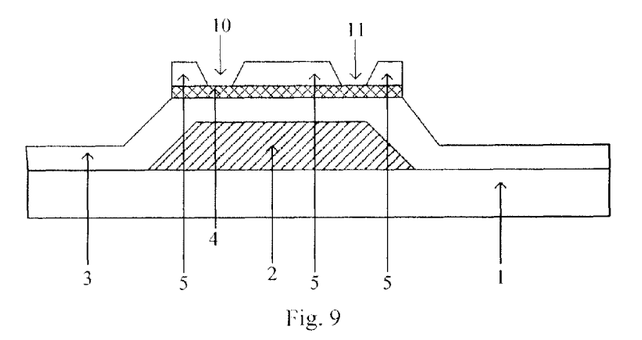

Herein, the exposed photoresist-non-reserved etch stop layer 5 and the exposed semiconductor layer 4 in the photoresist-non-unreserved regions 152 are etched, so as to remove the etch stop layer and semiconductor layer in these regions, as a result, the remaining semiconductor layer 4 forms the pattern of the semiconductor layer (as shown in FIG. 7). Then, the photoresist of the photoresist-partially-reserved regions 153 is completely removed by one ashing process, at the same time the photoresist of the photoresist-completely-reserved regions 151 becomes thinner but still exists. After that, the exposed etch stop layer 5 in the photoresist-partially-reserved region 153s is etched so as to form holes 10 and 11 penetrating the etch stop layer 5 (as shown in FIG. 9). The semiconductor layer will be electrically connected with the source and drain electrodes via holes 10 and 11, respectively. At last, the remaining photoresist is peeled off, and the cross-section structure shown in FIG. 9 is obtained. The photolithography process is finished at this point.

With the steps S14 and S15, the patterns of the semiconductor layer and etch stop layer can be formed by just one photolithography process (the second photolithography process). Therefore, the method in the present embodiment can save one photolithography process compared to the method which uses two photolithography processes to form the semiconductor layer and the etch stop layer respectively, so that the cost can be reduced and the production efficiency can be improved. Meanwhile, the connections between the semiconductor layer 4 and the source/drain electrodes are preferably achieved by the holes, which can reduce the damage to the semiconductor layer during the photolithography process to the etch stop layer, and be favorable for improvement of the performance of the thin film transistors. In addition, the production efficiency will be further improved because the through-hole structure can greatly reduce the surface area needed to be etched in the etch stop layer.

Besides, in the method of the present embodiment, the etch stop layer of the semiconductor layer is formed just after the formation of the metal oxide semiconductor layer, which can reduce the intermediate steps of the process, and avoid the damage to the semiconductor layer from the intermediate steps, so the semiconductor layer can be well protected. Besides, a fairly good contact interface can be formed between the semiconductor layer and the etch stop layer by directly forming the etch stop layer on the semiconductor layer, which is favorable to the improvement of the electric property of the metal oxide thin film transistors.

Step S16, forming patterns of the source and drain electrodes, data lines and pixel electrodes on the substrate formed with patterns of the semiconductor layer and the exposed contact zone.

Herein, forming patterns of the source and drain electrodes, data lines and pixel electrodes can also be achieved by one photolithography process. At this time the step S16 can specifically comprise the following steps:

Step A, forming a transparent pixel metal layer on the substrate after the completion of step S15, and forming a source/drain metal layer on the transparent pixel metal layer.

Specifically, the transparent pixel metal layer and the source/drain metal layer are deposited on the substrate sequentially by sputtering, thermal evaporation, or the like, after the completion of step S15. The thickness of the transparent pixel metal layer can be 300-1500 Å. The material of the layer can be transparent metal oxide, such as indium tin oxide (ITO), indium zinc oxide (IZO), aluminum zinc oxide, or the like. The thickness of the source/drain metal layer can be 2000-4000 Å, and its material can be metals, such as Cr, W, Ti, Ta, Mo, or their alloy. The structure of the source/drain metal layer can be of a single-layer structure or a multi-layer structure with at least two layers. The deposited source/drain metal layer can form an electrical connection with the semiconductor layer by the contact areas (e.g. holes) via the transparent pixel metal layer.

Step B, forming a second photoresist layer on the source/drain metal layer, and forming a photoresist-completely-reserved region, a photoresist-non-unreserved region and a photoresist-partially-reserved region of the second photoresist layer by one exposure and development process with a half-tone or gray-tone mask.

Herein, a half-tone or gray-tone mask with a designed graph is adopted to perform the exposure and development process so as to form a photoresist-completely-reserved region, a photoresist-non-unreserved region and a photoresist-partially-reserved region of the second photoresist layer. The photoresist-completely-reserved region corresponds to the source and drain electrodes and the data lines, while the photoresist-partially-reserved region corresponds to the transparent pixel electrode.

Step C, etching and removing the source/drain metal layer and the transparent pixel metal layer corresponding to the photoresist-non-unreserved regions of the second photoresist layer so as to form a pattern of the pixel electrodes;

Herein, the source/drain metal layer and the transparent pixel metal layer corresponding to the photoresist-non-unreserved regions of the second photoresist layer is etched, so that the remaining transparent pixel metal layer will form the pattern of the pixel electrodes.

Figure 11:
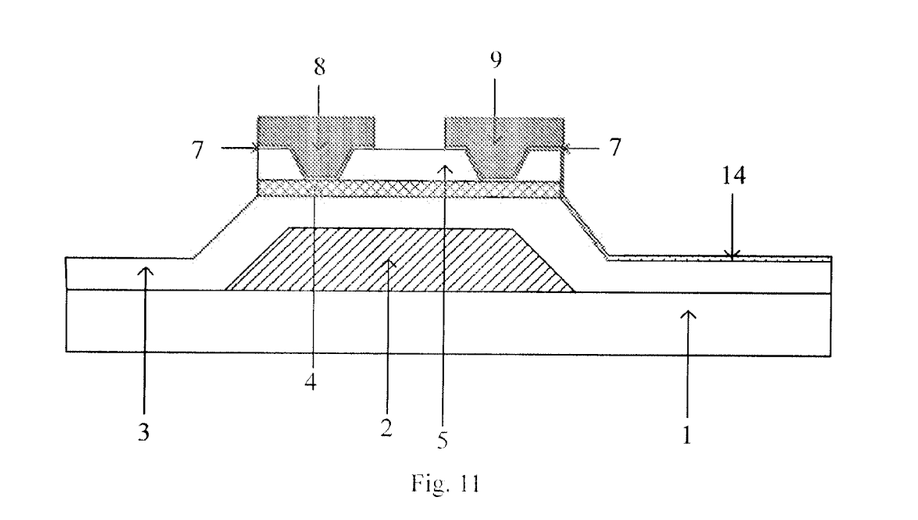
FIG. 11 is the cross-section schematic diagram of an array substrate provided in an embodiment of the present invention along line A-B as showed in FIG. 10.

Step D, removing the photoresist in the photoresist-partially-reserved region of the second photoresist layer by one photoresist ashing process so as to expose the source/drain metal layer, and then etching the exposed source/drain metal layer to form patterns of the source and drain electrodes and data lines; Finally, peeling off the remaining photoresist to form the array substrate as shown in FIG. 10 and FIG. 11, wherein FIG. 10 is the planar diagram of the array substrate and FIG. 11 is the cross-section diagram of the array substrate.

As we can see from the steps A to D described above, the present embodiment can form patterns of the source electrode 8, the drain electrode 9, data lines 13 and the transparent pixel electrode 14 by one photolithography process (the third photolithography process). Besides, the transparent pixel metal layer is located under the source and drain electrodes. As a result, the transparent pixel electrode 14 can directly in contact with the semiconductor layer 4, so that the contact resistance between the source/drain electrodes and the semiconductor layer can be reduced, which is favorable for the formation of the stable contact interface and for the improvement of the electrical property of the metal oxide thin film transistor.

In summary, in the process of forming an array substrate according to the present embodiment, the patterns as required can be formed by using just three photolithography processes. The method in the present embodiment can reduce the number of the photolithography process and simplify the manufacturing process compared to the state of the art, so as to reduce the manufacturing cost and improve the production efficiency.

As an optional step, after the step S16, the present embodiment can further form a passivation layer on the substrate after the completion of the step S16, and then, perform a fourth photolithography process on the passivation layer to form a pattern of the passivation layer. Herein, the passivation layer can be fabricated by a Chemical Vapor Deposition (CVD) process, and the passivation layer can be a single-layer film made from materials of silicon dioxide, silicon nitride, or the like, or can be a multi-layer film with at least two layers. Each layer is made from materials of silicon dioxide, silicon nitride, or the like. The material of the respective layers can be the same, or can be different from each other.

Embodiment 2

The present embodiment provides another manufacturing method of an array substrate. The method comprises the following steps:

Step S21, forming a gate metal layer on a substrate, and forming patterns of gate electrode and gate lines by the first photolithography process;

Step S22, forming a gate insulating layer on the substrate after the completion of the first photolithography process;

Step S23, forming a semiconductor layer on the substrate after the completion of step S22, and forming an etch stop layer on the semiconductor layer, wherein the material of the semiconductor layer can be metal oxide;

Step S24, forming a first photoresist layer on the etch stop layer, and forming a photoresist-completely-reserved region, a photoresist-non-unreserved region and a photoresist-partially-reserved region of the first photoresist layer by one exposure and development process with a half-tone or gray-tone mask;

Step S25, etching and removing both the etch stop layer and the semiconductor layer corresponding to the photoresist-non-unreserved regions of the first photoresist layer so as to form a pattern of the semiconductor layer, and removing the photoresist in the photoresist-partially-reserved region of the first photoresist layer by one photoresist ashing process so as to expose the etch stop layer, and then etching the exposed etch stop layer to expose such a contact zone of the semiconductor layer that the contact zone are to be connected with the source and drain electrodes.

Since the steps S21 to S25 are the same as the steps S11 to S15 in Embodiment 1, they will not be described here.

Step S26, forming a source/drain metal layer on the substrate formed with the patterns of the semiconductor layer and the exposed contact zone. The source/drain metal layer can be deposited by sputtering, thermal evaporation, or the like. The material of it can be Cr, W, Ti, Ta, Mo, or the like, and their alloys, and the source/drain metal layer can be of a single-layer structure or a multi-layer structure with at least two layers. The deposited source/drain metal layer can be electrically connected to the semiconductor layer via the structure like holes.

Step S27, etching the source/drain metal layer by using one photolithography process (the third photolithography process) to form the patterns of the source and drain electrodes and the data lines.

Step S28, depositing a passivation layer on the substrate after the completion of the third photolithography process, and forming the pattern of the passivation layer by the fourth photolithography process.

Herein, the passivation layer can be deposited by a CVD process. Then, a hole is formed in the passivation layer by the photolithography process for the use of connecting the pixel electrode to the drain electrode.

Step S29, depositing a transparent pixel metal layer on the substrate after the completion of the fourth photolithography process, and performing the fifth photolithography process to form the pattern of pixel electrodes, wherein the pixel electrodes are disposed within pixel regions defined by the gate lines and data lines. Each of the pixel electrodes is connected to the drain electrode.

Herein, the transparent pixel metal layer can be deposited by a sputtering process and then, the pattern of the pixel electrodes are formed by the photolithography process, wherein each of the pixel electrodes is connected to the drain electrode via the hole in the passivation layer.

Figure 12:
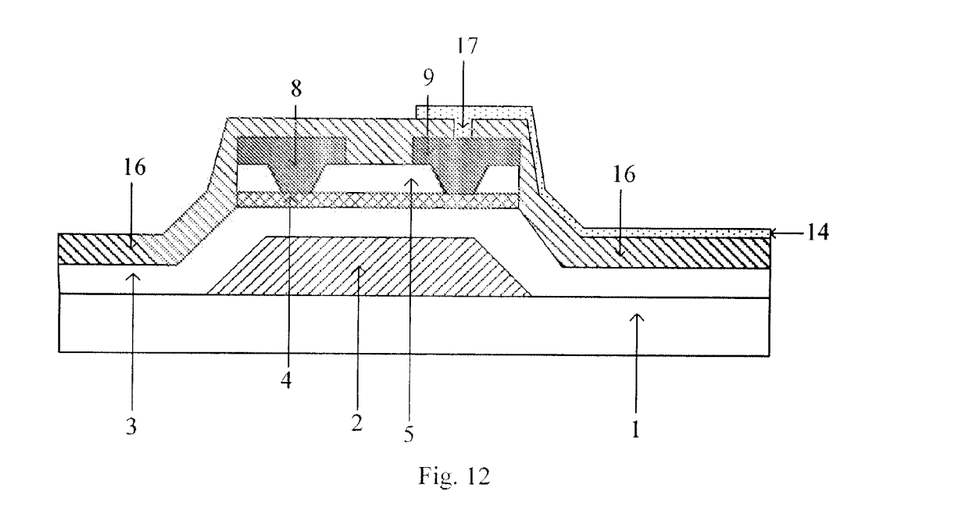
FIG. 12 is the cross-section schematic diagram of another array substrate provided in an embodiment of the present invention.

The cross-section diagram of the substrate processed with the above steps S21 to S29 is shown in FIG. 12. We can see that the passivation layer 16 covers the source electrode 8, drain electrode 9, the gate insulating layer 3 and the etch stop layer 5. The pixel electrode 14 covers the passivation layer 16 and it is connected to the drain electrode 9 via the hole 17.

Based on the manufacturing method of an array substrate provided by the above embodiments, the embodiment of the invention further provides an array substrate and a display device, wherein the array substrate can be formed by any one of the above-mentioned manufacturing methods. The display device comprises the array substrate manufactured by any one of the above-mentioned embodiments. The display device can be a liquid crystal display device, organic light emitting diode display, etc.

Specifically, an array substrate provided by an embodiment of the present invention, as shown in FIG. 10 and FIG. 11, comprises:

A substrate 1, the substrate can be glass substrate, quartz substrate, plastic substrate, etc.

A gate electrode 2 and gate line 12, formed on the substrate 1. The materials of the gate electrode 2 and gate line 12 can be metals, such as chromium (Cr), tungsten (W), titanium (Ti), tantalum (Ta), molybdenum (Mo), aluminum (Al), copper (Cu), or the alloys of the above metals, and the structure of each of the gate electrode and gate line can be a metal single-layer structure, or a metal multi-layer structure with at least two layers.

A gate insulating layer 3, formed on the gate line 12 and the gate electrode 2 and covers the entire substrate 1, the materials of the gate insulating layer 3 can be silicon oxide (e.g. SiOx), silicon nitride (e.g. SiNx), silicon oxynitride, or the like.

A semiconductor layer 4, located over the gate electrode 2 and formed on the gate insulating layer 3, the semiconductor layer can be made of metal oxide, and the metal oxide can be IGZO, HIZO, IZO, a-InZnO, a-InZnO, ZnO:F, $In_2O_3$:Sn, $In_2O_3$:Mo, $Cd_2SnO_4$, ZnO:Al, $TiO_2$:Nb, Cd—Sn—O, or the like.

An etch stop layer 5, formed on the semiconductor layer 4, and the etch stop layer 5 is provided with holes formed therein. Specifically, the material of the etch stop layer 5 can be silicon oxide, silicon nitride or silicon oxynitride, the material of the etch stop layer can also be $Al_2O_3$, the etch stop layer can be of a single-layer or multiple-layer structure.

A source electrode 8 and A drain electrode 9, formed on the etch stop layer 5. The materials of the source electrode 8 and the drain electrode 9 can be metals, such as Cr, W, Ti, Ta, Mo, or the alloys of the metals. The source electrode 8 and drain electrode 9 can be connected to the semiconductor layer 4 via holes penetrating the etch stop layer 5.

A transparent pixel metal layer 7, disposed between the drain electrode 9 and the etch stop layer 5, and also between the source electrode 8 and the etch stop layer 5. The material of the transparent pixel metal layer can be ITO, IZO or other transparent metal oxides. The source and the drain electrodes are electrically connected to the semiconductor layer via the transparent pixel metal layer 7.

A pixel electrode 14, formed on the gate insulating layer 3. The pixel electrode 14 and the transparent pixel metal layer 7 are made of one layer of same material and connected together.

Preferably, in the array substrate, the thickness of the gate metal layer can be 500 Å~4000 Å. The thickness of the gate insulating layer can be 2000 Å~5000 Å. The thickness of the semiconductor layer can be 50 Å~1000 Å. The thickness of the etch stop layer can be 500 Å~3000 Å. The thickness of the transparent pixels metal layer can be 300 Å~1500 Å. The thickness of the source and drain metal layer can be 2000 Å~4000 Å.

As shown in FIG. 12, another array substrate provided by an embodiment of the present invention comprises:

A substrate 1;

A gate electrode 2 and gate lines (not shown in FIG. 12), formed on the substrate 1;

A gate insulating layer 3, formed on the gate lines and gate electrode 2 and covers the entire substrate 1;

A metal oxide semiconductor layer 4, disposed over the gate electrode 2 and formed on the gate insulating layer 3;

An etch stop layer 5, formed on the metal oxide semiconductor layer 4 and provided with holes formed in the etch stop layer;

A source electrode 8 and a drain electrode 9, formed on the etch stop layer 5. The source electrode 8 and drain electrode 9 are respectively electrically connected to the semiconductor layer via corresponding hole penetrating the etch stop layer 5;

A passivation layer 16, formed over the source electrode 8, the drain electrode 9, the gate insulating layer 3 and the etch stop layer 5;

A pixel electrodes 14, formed on the passivation layer 16, and the pixel electrode 14 is electrically connected with the drain electrode 9 by the hole 17 in the passivation layer 17.

According to the embodiments of the present invention, at least the following structure and method can be provided.

(1) A manufacturing method of an array substrate, comprising:

forming patterns of gate electrodes and gate lines, and a gate insulating layer on a substrate;

forming a semiconductor layer on the substrate formed with the gate insulating layer and the patterns of the gate electrodes and the gate lines, and forming an etch stop layer on the semiconductor layer;

forming a first photoresist layer on the etch stop layer, and forming a photoresist-completely-reserved region, a photoresist-non-unreserved region and a photoresist-partially-reserved region of the first photoresist layer by one exposure and development process with a half-tone or gray-tone mask;

etching and removing the etch stop layer and the semiconductor layer corresponding to the photoresist-non-unreserved regions of the first photoresist layer so as to form a pattern of the semiconductor layer, and removing the photoresist in the photoresist-partially-reserved region of the first photoresist layer by one photoresist ashing process so as to expose the etch stop layer, and then etching the exposed etch stop layer to expose such a contact zone of the semiconductor layer that the contact zone are to be electrically connected with source and drain electrodes;

forming patterns of the source and drain electrodes, data lines and pixel electrodes on the substrate formed with the patterns of the semiconductor layer and the exposed contact zone.

(2) The method according to (1), wherein,
said forming patterns of the source and drain electrodes, data lines and pixel electrodes comprising:
forming a transparent pixel metal layer on the substrate formed with said pattern of the semiconductor layer and said exposed contact zone;
forming a source/drain metal layer on said transparent pixel metal layer;
forming a second photoresist layer on said source/drain metal layer, and forming a photoresist-completely-reserved region, a photoresist-non-unreserved region and a photoresist-partially-reserved region of said second photoresist layer by one exposure and development process with a half-tone or gray-tone mask;
etching and removing the source/drain metal layer and the transparent pixel metal layer corresponding to said photoresist-non-unreserved regions of said second photoresist layer so as to form a pattern of the pixel electrodes;
removing the photoresist in said photoresist-partially-reserved region of said second photoresist layer by one photoresist ashing process so as to expose the source/drain metal layer, and then etching the exposed source/drain metal layer to form patterns of the source and drain electrodes and the data lines.

(3) The method according to (1), wherein,
said forming patterns of the source and drain electrodes, data lines and pixel electrodes comprising:
forming a source/drain metal layer on said substrate formed with said pattern of the semiconductor layer and said exposed contact zone;
performing a photolithography process on said source/drain metal layer to form the patterns of the source and drain electrodes and the data lines;
forming a passivation layer on the substrate formed with said patterns of the source and drain electrodes and the data lines, and performing a photolithography process on said passivation layer so as to form a pattern of the passivation layer, and the passivation layer is provided with holes formed therein;
forming a transparent pixel metal layer on the substrate formed with said pattern of the passivation layer, and performing a photolithography process on said transparent pixel metal layer so as to form the pattern of pixel electrodes; said pixel electrodes are disposed within pixel regions defined by said gate lines and said data lines, and connected to said drain electrodes by said holes.

(4) The method according to any one of (1) to (3), wherein said forming patterns of gate electrodes and gate lines, and a gate insulating layer on a substrate comprising:
forming a gate metal layer on said substrate, and forming patterns of gate electrodes and gate lines by one photolithography process;
forming a gate insulating layer on the substrate formed with the patterns of the gate electrodes and the gate lines.

(5) The method according to any one of (1) to (4), wherein said source electrodes and drain electrodes are connected to said semiconductor layer by the holes penetrating said etch stop layer.

(6) The method according to any one of (1) to (5), wherein said semiconductor layer is metal oxide semiconductor, and is chosen from at least one of groups composed of IGZO, HIZO, IZO, a-InZnO, a-InZnO, ZnO:F, $In_2O_3$:Sn, $In_2O_3$:Mo, $Cd_2SnO_4$, ZnO:Al, $TiO_2$:Nb and Cd—Sn—O.

(7) The method according to any one of (1) to (6), the material of said etch stop layer is $Al_2O_3$, silicon oxide, silicon nitride, or silicon oxynitride, said etch stop layer has a single-layer structure or multi-layer structure.

(8) An array substrate, said array substrate is manufactured with the method according to any one of (1) to (7), said array substrate comprises:
a substrate;
gate electrodes and gate lines, formed on said substrate;
a gate insulating layer, formed over said gate electrode and said gate lines and covering the entire said substrate;
a semiconductor layer, disposed over said gate electrode and formed on said gate insulating layer;
an etch stop layer, formed on said metal oxide semiconductor layer, and said etch stop layer is provided with holes formed therein;
source electrodes and drain electrodes, formed on said etch stop layer, said source and drain electrodes are respectively electrically connected to said semiconductor layer via the respective holes.

(9) The array substrate according to (8), further comprising:
a transparent pixel metal layer, disposed between said drain electrodes and said etch stop layer, and also between said source electrodes and said etch stop layer, said source and drain electrodes are electrically connected to said semiconductor layer via said transparent pixel metal layer;
pixel electrodes, formed on said gate insulating layer, said pixel electrodes and said transparent pixel metal layer are made of one layer of same material and connected together.

(10) The array substrate according to (8), further comprising:
a passivation layer, formed on said source electrodes, said drain electrodes, said gate insulating layer and said etch stop layer;
pixel electrodes, formed on said passivation layer, said pixel electrodes are connected with said drain electrodes by the holes disposed in the passivation layer.

(11). A display device, comprising an array substrate of any one of (8) to (10).

What are described above is related to the illustrative embodiments of the disclosure only and not limitative to the scope of the disclosure; the scopes of the disclosure are defined by the accompanying claims.

The invention claimed is:
1. A method of manufacturing an array substrate, comprising:
forming patterns of gate electrodes and gate lines, and a gate insulating layer on a substrate;
forming a semiconductor layer on the substrate formed with said gate insulating layer and the patterns of said gate electrode and said gate lines, and forming an etch stop layer on top of and in contact with said semiconductor layer;
forming a first photoresist layer on top of and in contact with said etch stop layer, and forming a photoresist-completely-reserved region, a photoresist-completely-unreserved region and a photoresist-partially-reserved region of said first photoresist layer by one exposure and development process with a half-tone or gray-tone mask;
etching and removing the etch stop layer and the semiconductor layer corresponding to said photoresist-completely-unreserved regions of said first photoresist layer so as to form a pattern of the semiconductor layer, and removing the photoresist in said photoresist-partially-reserved region of said first photoresist layer by one photoresist ashing process so as to expose the etch stop layer, and then etching the exposed etch stop layer to expose such a contact zone of said semiconductor layer that the contact zone are to be electrically connected with source and drain electrodes;

forming patterns of the source and drain electrodes, data lines and pixel electrodes on the substrate formed with said patterns of the semiconductor layer and said exposed contact zone.

2. The method according to claim 1, wherein said forming patterns of the source and drain electrodes, data lines and pixel electrodes comprising:

forming a transparent pixel metal layer on the substrate formed with said pattern of the semiconductor layer and said exposed contact zone;

forming a source/drain metal layer on said transparent pixel metal layer;

forming a second photoresist layer on said source/drain metal layer, and forming a photoresist-completely-reserved region, a photoresist-completely-unreserved region and a photoresist-partially-reserved region of said second photoresist layer by one exposure and development process with a half-tone or gray-tone mask;

etching and removing the source/drain metal layer and the transparent pixel metal layer corresponding to said photoresist-completely-unreserved regions of said second photoresist layer so as to form a pattern of the pixel electrodes;

removing the photoresist in said photoresist-partially-reserved region of said second photoresist layer by one photoresist ashing process so as to expose the source/drain metal layer, and then etching the exposed source/drain metal layer to form patterns of the source and drain electrodes and the data lines.

3. The method according to claim 1, wherein said forming patterns of the source and drain electrodes, data lines and pixel electrodes comprising:

forming a source/drain metal layer on said substrate formed with said pattern of the semiconductor layer and said exposed contact zone;

performing a photolithography process on said source/drain metal layer to form the patterns of the source and drain electrodes, and the data lines;

forming a passivation layer on the substrate formed with said patterns of the source and drain electrodes, and the data lines, and performing a photolithography process on said passivation layer so as to form a pattern of the passivation layer, and the passivation layer is provided with holes formed therein;

forming a transparent pixel metal layer on the substrate formed with said pattern of the passivation layer, and performing a photolithography process on said transparent pixel metal layer so as to form the pattern of pixel electrodes; said pixel electrodes are disposed within pixel regions defined by said gate lines and said data lines, and connected to said drain electrodes by said holes.

4. The method according to claim 1, wherein said forming a pattern of gate electrodes and gate lines, and a gate insulating layer on a substrate comprising:

forming a gate metal layer on said substrate, and forming patterns of gate electrodes and gate lines by one photolithography process;

forming a gate insulating layer on the substrate formed with the patterns of the gate electrodes and the gate lines.

5. The method according to claim 1, wherein said source electrodes and drain electrodes are electrically connected to said semiconductor layer by the holes penetrating said etch stop layer.

6. The method according to claim 1, wherein said semiconductor layer is metal oxide semiconductor, and is chosen from at least one of groups composed of IGZO, HIZO, IZO, a-InZnO, a-InZnO, ZnO:F, $In_2O_3$:Sn, $In_2O_3$:Mo, $Cd_2SnO_4$, ZnO:Al, $TiO_2$:Nb and Cd—Sn—O.

7. The method according to claim 1, the material of said etch stop layer is $Al_2O_3$, silicon oxide, silicon nitride, or silicon oxynitride, said etch stop layer has a single-layer structure or multi-layer structure.

8. An array substrate, said array substrate is manufactured with the method according to claim 1, said array substrate comprises:

a substrate;

gate electrodes and gate lines formed on said substrate;

a gate insulating layer, formed on said gate electrodes and said gate lines and covering the entire said substrate;

a semiconductor layer, arranged over said gate electrodes and formed on said gate insulating layer;

an etch stop layer, formed on top of and in contact with said semiconductor layer, and said etch stop layer is provided with holes formed therein to expose a contact zone of said semiconductor layer;

source electrodes and drain electrodes, formed on said etch stop layer, said source and drain electrodes are respectively electrically connected to the contact zone of said semiconductor layer via the respective holes.

9. The array substrate according to claim 8, further comprising:

a transparent pixel metal layer disposed between said drain electrodes and said etch stop layer, and also between said source electrodes and said etch stop layer, said source and drain electrodes are electrically connected to said semiconductor layer via said transparent pixel metal layer;

pixel electrodes, formed on said gate insulating layer, said pixel electrodes and said transparent pixel metal layer are made of one layer of same material and connected together.

10. The array substrate according to claim 8, further comprising:

a passivation layer, formed on said source electrodes, said drain electrodes, said gate insulating layer and said etch stop layer;

pixel electrodes, formed on said passivation layer, said pixel electrode are connected with said drain electrodes by the holes disposed in the passivation layer.

11. A display device, comprising an array substrate according to claim 8.

12. The method according to claim 2, wherein said forming a pattern of gate electrodes and gate lines, and a gate insulating layer on a substrate comprising:

forming a gate metal layer on said substrate, and forming patterns of gate electrodes and gate lines by one photolithography process;

forming a gate insulating layer on the substrate formed with the patterns of the gate electrodes and the gate lines.

13. The method according to claim 3, wherein said forming a pattern of gate electrodes and gate lines, and a gate insulating layer on a substrate comprising:

forming a gate metal layer on said substrate, and forming patterns of gate electrodes and gate lines by one photolithography process;

forming a gate insulating layer on the substrate formed with the patterns of the gate electrodes and the gate lines.

14. The method according to claim 2, wherein said source electrodes and drain electrodes are electrically connected to said semiconductor layer by the holes penetrating said etch stop layer.

15. The method according to claim 3, wherein said source electrodes and drain electrodes are electrically connected to said semiconductor layer by the holes penetrating said etch stop layer.

16. The method according to claim 4, wherein said source electrodes and drain electrodes are electrically connected to said semiconductor layer by the holes penetrating said etch stop layer.

17. The array substrate according to claim 8, wherein a width of the etch stop layer is same as a width of the semiconductor layer.

18. The array substrate according to claim 17, wherein a width of the contact zone is smaller than the width of the etch stop layer.

19. The array substrate according to claim 8, wherein the outmost sidewall of the source electrode or the drain electrode is flush with an end side of the etch stop layer.

* * * * *